(12) United States Patent
Hasegawa et al.

(10) Patent No.: US 7,023,749 B2
(45) Date of Patent: *Apr. 4, 2006

(54) SEMICONDUCTOR INTEGRATED CIRCUIT DEVICE

(75) Inventors: Masatoshi Hasegawa, Ome (JP); Shuichi Miyaoka, Hanno (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/040,030

(22) Filed: Jan. 24, 2005

(65) Prior Publication Data

US 2005/0162969 A1    Jul. 28, 2005

Related U.S. Application Data

(63) Continuation of application No. 10/412,264, filed on Apr. 14, 2003, now Pat. No. 6,865,127.

(30) Foreign Application Priority Data

Apr. 22, 2002    (JP) .............................. 2002-119411

(51) Int. Cl.
*G11C 7/00* (2006.01)
(52) U.S. Cl. ...................... 365/203; 365/190
(58) Field of Classification Search .................... None
See application file for complete search history.

(56) References Cited

U.S. PATENT DOCUMENTS

| 4,893,277 | A | 1/1990 | Kajigaya et al. ............ 365/203 |
| 5,062,082 | A | 10/1991 | Choi ........................ 365/230.06 |
| 5,315,555 | A | 5/1994 | Choi ......................... 365/207 |
| 5,355,343 | A | 10/1994 | Shu et al. .................... 365/203 |
| 5,357,468 | A * | 10/1994 | Satani et al. ............ 365/189.01 |
| 5,517,451 | A | 5/1996 | Okuzawa .................... 365/203 |
| 5,539,700 | A | 7/1996 | Kawahara et al. .......... 365/203 |
| 5,636,174 | A | 6/1997 | Rao ........................ 365/230.03 |
| 5,659,512 | A | 8/1997 | Koyanagi et al. ........... 365/203 |
| 5,835,449 | A | 11/1998 | Lee .......................... 365/238.5 |
| 6,026,035 | A | 2/2000 | Kim ........................... 365/190 |

(Continued)

FOREIGN PATENT DOCUMENTS

JP    7-37387    7/1993

(Continued)

OTHER PUBLICATIONS

Toyoji Yamamoto, Kenichi Uwasawa, and Tohru Mogami; "Bias Temperature Instability in Scaled p+ Polysilicon Gate p-MOSFET's"; IEE Transactions on Electron Devices, vol. 46, No. 5; May 1999, pp 921-926.

*Primary Examiner*—Tan T. Nguyen
(74) *Attorney, Agent, or Firm*—Reed Smith LLP; Stanley P. Fisher, Esq.; Juan Carlos A. Marquez, Esq.

(57) ABSTRACT

The present invention provides a semiconductor integrated circuit device equipped with a memory circuit, which realizes speeding up of its operation in a simple configuration or realizes high reliability and enhancement of product yields in a simple configuration. A memory cell is selected from within a memory array having a plurality of memory cells by a selector or selection circuit. MOSFETs constituting a precharge circuit provided for signal lines for transferring a read signal therefrom to a main amplifier are respectively brought to an on state based on a memory cell select start signal transferred to the selection circuit and brought to an off state prior to the transfer of the read signal from the memory cell to thereby complete precharging, whereby NBTI degradation at standby is avoided.

7 Claims, 9 Drawing Sheets

U.S. PATENT DOCUMENTS

| | | | |
|---|---|---|---|
| 6,147,916 A | 11/2000 | Ogura | 365/203 |
| 6,185,151 B1 | 2/2001 | Cho | 365/233 |
| 6,205,069 B1 | 3/2001 | Kim | 365/203 |
| 6,275,429 B1 * | 8/2001 | Bae et al. | 365/203 |
| 6,320,806 B1 | 11/2001 | Han | 365/203 |
| 6,865,127 B1 * | 3/2005 | Hasegawa et al. | 365/203 |

FOREIGN PATENT DOCUMENTS

JP     10-21686     6/1996

* cited by examiner

SEMICONDUCTOR INTEGRATED CIRCUIT DEVICE

This application is a Continuation application of nonprovisional U.S. Ser. No. 10/412,264 filed on Apr. 14, 2003 now U.S. Pat. No. 6,865,127. Priority is claimed based upon U.S. application Ser. No. 10/412,264 filed on Apr. 14, 2003, which claims the priority date of Japanese Patent Application 2002-119411 filed on Apr. 22, 2002.

BACKGROUND OF THE INVENTION

The present invention relates to a semiconductor integrated circuit device, and to a technology effective for application to a device equipped with a memory circuit.

It has been reported that according to the known prior art search subsequent to the completion of the invention of the present application, Unexamined Patent Publication No. Hei 10(1998)-21686 (hereinafter called "a patent document 1") and Unexamined Patent Publication No. Hei 7(1995)-37387 (hereinafter called "a patent document 2") have been disclosed as ones wherein precharge circuits are respectively provided for signals lines for transferring read signals from memory cells as in the invention of the present application. Disclosed in the patent document 1 is that a memory circuit using capacity is provided for signals lines to properly perform a stage division of pipelines in a synchronous dynamic RAM (Random Access Memory), and a signal corresponding to an intermediate potential necessary for an amplifying operation of a main amplifier is stored in such a memory circuit to thereby provide a high-speed signal voltage. The patent document 2 discloses a circuit for supplying two types of write and read precharge voltages to signal lines according to operation modes.

As a laid-open document example related to a degradation phenomenon of a MOS device due to the bias of each gate and temperature, which is called NBTI (Negative Bias Temperature Instability), there has been known IEEE TRANSACTIONS ON ELECTRON DEVICES, VOL. 46, NO. 5, pp. 921–926, MAY, 1999. While the precharge circuit exists in the patent documents 1 and 2, no attention is paid to the NBTI.

SUMMARY OF THE INVENTION

The inventors of the present application have taken note of the fact that in a memory circuit of a dynamic RAM or the like, P channel MOSFETs for precharging IO lines for transferring read signals are brought to an on state upon standby free of execution of both reading and writing and placed under a bias condition in which they are most subject to the NBTI degradation. When a threshold voltage Vth of each precharge MOSFET referred to above increases due to the NBTI degradation, the time necessary for the precharge becomes long correspondingly.

In the synchronous DRAM, for example, when a column address strobe signal CASN is asserted low in level as shown in a waveform diagram of FIG. 11, a precharge signal IOPR is brought to a high level and the precharge of read IO lines RIOT/RIOB is completed. Thereafter, a column select signal YS is raised to thereby read a signal amount with amplification polarity of each bit line, which has been amplified by a sense amplifier SA, into the post-precharge read IO lines RIOT/RIOB. When the amplification of a main amplifier MA is completed, the precharge signal IOPR is rendered low in level again in preparation with the following read cycle to precharge the IO lines RIOT/RIOB.

Since a standby period, which takes up most of the time upon an actual use, is held in a state in which the IO lines RIOT/RIOB have been precharged, the precharge MOSFETs are under a bias state in which NBTI degradation with a gate voltage (Vgs) being negative, proceeds. Thus, the precharge time becomes long due to the degradation of the precharge MOSFETs, thereby inhibiting the speeding up of a CAS cycle. Namely, no problem occurs in the initial or first cycle for executing transition to a memory access from the standby period. There may, however, be cases in which in a burst mode for continuously performing reading in synchronism with the column address strobe signal CASN, a precharge period is extended as indicated by dotted lines due to the NBTI degradation, and a signal corresponding to the next address from the sense amplifier is outputted before the completion of precharging, in other words, in a state in which part of the signal amount is being left behind, thereby causing a malfunction due to mixing with such a signal.

In order to avoid such a malfunction, there is a need to set a time margin having taken into consideration the extension of the precharge time due to the NBTI degradation and thereby set a burst mode. Namely, a problem arises in that there is a need to make a clock cycle of a clock CLKN longer by the time margin, so that the memory circuit is made slow in operating speed. In other respects, product yields are reduced because the memory circuit with no time margin is regarded as faulty.

An object of the present invention is to provide a semiconductor integrated circuit device provided with a memory circuit, which realizes the speeding up of its operation in a simple configuration. Another object of the present invention is to provide a semiconductor integrated circuit device equipped with a memory circuit, which realizes high reliability and enhancement of product yields in a simple configuration. The above, other objects, and novel features of the present invention will become apparent from the description of the present specification and the accompanying drawings.

A summary of a representative one of the inventions disclosed in the present application will be described in brief as follows: A memory cell is selected from within a memory array having a plurality of memory cells by a selector or selection circuit. MOSFETs constituting a precharge circuit provided for signal lines used for transferring a read signal therefrom to a main amplifier are respectively brought to an on state based on a memory cell select start signal transferred to the selection circuit and brought to an off state prior to the transfer of the read signal from the memory cell to thereby complete precharging, whereby NBTI degradation at standby is avoided.

DETAILED DESCRIPTION OF THE PREFERRED EMBODIMENTS

Preferred embodiments of the present invention will hereinafter be described in detail with reference to the accompanying drawings.

Figure 1:
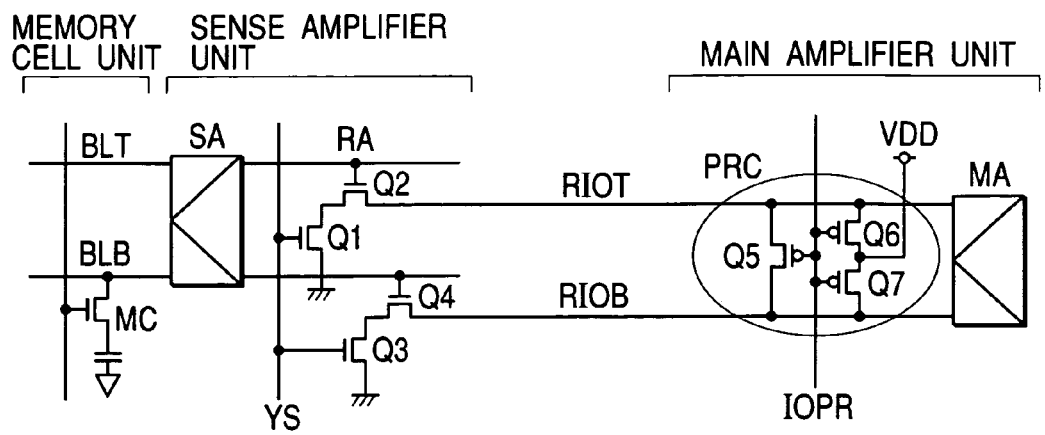
FIG. 1 is a circuit diagram showing one embodiment of a read system from a sense amplifier SA of a dynamic RAM mounted in a semiconductor integrated circuit device according to the present invention to a main amplifier MA thereof.

FIG. 1 is a circuit diagram of one embodiment of a read system from a sense amplifier SA of a dynamic RAM mounted in a semiconductor integrated circuit device according to the present invention to a main amplifier MA thereof. A memory cell unit is typically shown which comprises one word line WL, a pair of bit lines BLT and BLB extending in parallel, and a dynamic memory cell MC provided at an intersecting point of the word line WL and one bit line BLB, all of which are illustratively shown as representatives. The dynamic memory cell MC has a gate connected to the word line WL and drain-source paths whose one is connected to the bit line BLB, and comprises a memory capacitor having a storage node to which the other thereof is connected.

The symbol BL indicates a bit line. T added to the end thereof means the true (non-inversion) of a logic symbol and B means the bar (inversion). This T/B is used even in RIO indicative of each read signal line to be described later as in the case of RIOT/RIOB. Further, N added to each signal to be described later means negative and is indicative of being active (negative logic) when low in level. In the drawings, ○ marks each indicative of "inversion", which are added to the gates, means P channel MOSFETs. The P channel MOSFETs are distinguished from N channel MOSFETs by the marks.

A sense amplifier unit comprises a sense amplifier SA constituent of a CMOS latch circuit represented by a black box in the same drawing, and a read amplifier RA. The read amplifier RA comprises column selecting MOSFETs Q1 and Q3, and amplifying MOSFETs Q2 and Q4. The gates of the MOSFETs Q1 and Q3 used as the column selection switches are switch-controlled by a column select signal YS so that a pair of amplified signals of the sense amplifier SA, i.e., amplified signals on the complementary bit lines BLB and BLT of the memory cell unit are transferred to their corresponding gates of the amplifying MOSFETs Q2 and Q4.

A series circuit of the MOSFETs Q1 and Q2, and Q3 and Q4 constituting the read amplifier RA is provided between the pair of read signal lines RIOT/RIOB and a circuit's ground potential. One of the read signal lines RIOT/RIOB is discharged in response to the corresponding amplified signal of the sense amplifier SA to thereby perform an amplifying operation.

In order to perform the amplifying operation by such a read amplifier RA as described above, a precharge circuit is provided for the read signal lines RIOT/RIOB. The precharge circuit comprises a P channel MOSFET Q5 for short-circuiting the read signal lines RIOT/RIOB, and P channel MOSFETs Q6 and Q7 for supplying a precharge voltage VDD to the signal lines RIOT/RIOB respectively. Before the amplifying operation by the read amplifier RA, the precharge circuit precharges the read signal lines RIOT/RIOB to a power supply voltage VDD and discharges one of the signal lines to the circuit's ground potential (low level) according to the amplifying operation of the read amplifier RA to thereby form amplifying signals necessary for an amplifying operation of the main amplifier MA.

Although not restricted in particular, the precharge circuit is provided in the main amplifier unit. Namely, an input unit of the main amplifier MA comprised of a differential amplifier circuit is provided with the MOSFETs Q5 through Q7 constituting the precharge circuit. When the main amplifier MA starts its amplifying operation, it sets differential inputs to equal precharge voltages.

Figure 2:
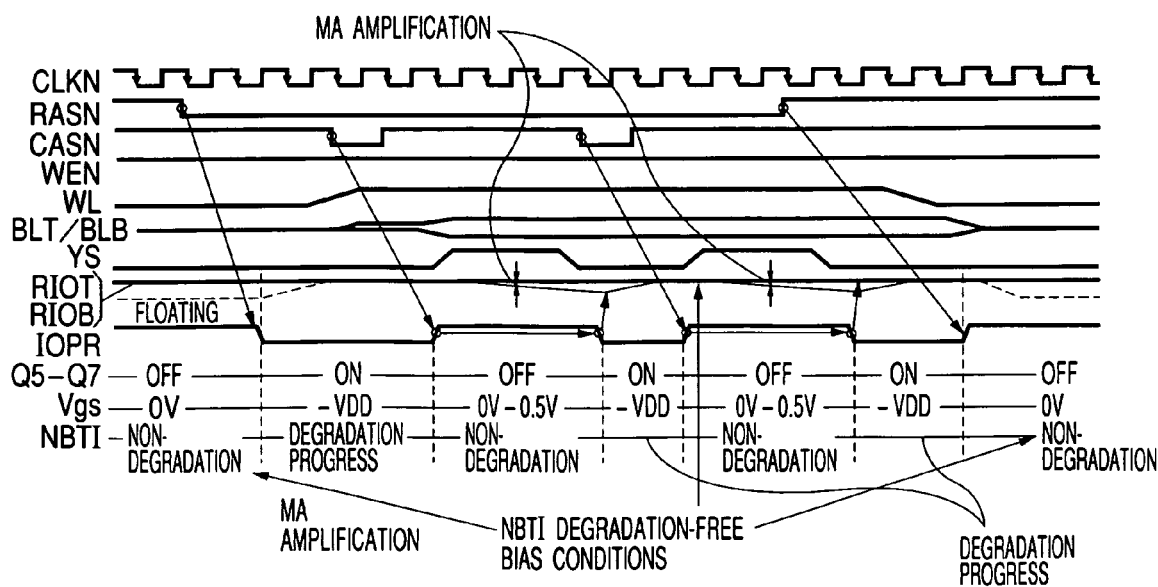
FIG. 2 is a timing diagram for describing one example of the operation of the dynamic RAM shown in FIG. 1.

A timing diagram for describing one example of the operation of the dynamic RAM shown in FIG. 1 is shown in FIG. 2. Although not restricted in particular, the dynamic RAM according to the present embodiment is intended for a DRAM operated in synchronization with a clock CLKN. Alternatively, the clock CLK may adopt a clock signal, i.e., a system clock signal of a memory control circuit for generating the respective signals RASN, CASN, WEN, etc. without being directly supplied to the dynamic RAM.

In the present embodiment, a precharge signal IOPR is brought to a high level when a row address strobe signal RASN is in a standby state indicative of a high level. Thus, the P channel MOSFETs Q5 through Q7 constituting the precharge circuit are respectively brought to an off state. The read signal lines RIOT/RIOB are respectively brought to a floating state with the off states of the MOSFETs Q5 through Q7 and hence their levels are undefined.

In synchronization with the edge at which the clock signal CLKN falls to a low level, the row address strobe signal RASN is rendered low in level so that a row address signal is taken in or captured to start a row selective operation. With a change of the signal RASN to the low level, the precharge signal IOPR is taken low in level so that the P channel MOSFETs Q5 through. Q7 are respectively brought to an on state. As a result, the read signal lines RIOT/RIOB are supplied with the precharge voltage like the power supply voltage VDD.

With the row selective operation, the word line WL is raised so that one of the bit lines BLT and BLB is brought to a voltage corresponding to an electrical charge stored in the corresponding memory cell, and the other thereof maintains the precharge voltage. Therefore, a small amount of signal corresponding to the difference between the voltage and the precharge voltage is amplified by the sense amplifier SA comprised of the CMOS latch circuit, and a small difference in potential between the bit lines BLT and BLB is expanded to a high level/low level corresponding to an operating voltage of the sense amplifier SA, so that a rewrite (refresh) operation is effected on a memory capacitor of a selected memory cell.

In consideration of the row selective operation referred to above, a column address strobe signal CASN is taken low in level in synchronism with, for example, a third cycle of the clock signal CLKN as viewed from the falling edge of the RASN so that capturing of a column address and its decode operation are started. In response to a change of the CASN to the low level, the precharge signal IOPR is taken high in level so that a precharge operation is completed. In response to the completion of the precharge operation, one column select signal YS is brought to a high level by the decode operation, so that one of the read signal lines RIOT/RIOB is discharged by the read amplifier RA. The discharged signal is amplified by the main amplifier MA, after which it is outputted through an unillustrated output circuit.

In a burst mode (or page mode) for performing switching between continuous column addresses, the column select signal YS is reset to a low level in response to the completion of the amplifying operation of the main amplifier MA so that the precharge signal IOPR is taken low in level. Thus, the read signal lines RIOT/RIOB are precharged to the power supply voltage VDD in preparation for the next read operation to equalize the read signals.

When the CASN is taken low in level again in synchronism with the clock signal CLKN, the capturing of a column address or the updating thereof by a counter is carried out. In response to the change of the CASN to the low level, the precharge signal IOPR is brought to the high level again to complete the precharge operation. The column select signal YS corresponding to the updated column address is taken high in level according to the completion of the precharge operation, so that read signals on the bit lines BLT/BLB, corresponding to it are transferred onto the read signal lines RIOT/RIOB via the read amplifier RA. Thus, one of the read signal lines RIOT/RIOB is discharged and thereafter the discharged signal is amplified by the main amplifier MA, followed by its output via the unillustrated output circuit.

In order to speed up the read cycle (CAS cycle) of the column system as described above, the time required to read the amounts of signals into the read signal lines RIOT/RIOB and the time required to precharge the read signal lines RIOT/RIOB must be made fast or speeded up. The precharge time is determined by a load on the read signal lines RIOT/RIOB and a current driving force of the precharge MOSFETs Q5 through Q7. It must be designed to assume the optimum value due to the fact that even though the current driving force increases if gate widths W of the precharge MOSFETs Q5 through Q7 are made great, a layout area increases, the signal lines RIOT/RIOB increase in parasitic capacitance, and the coupling between the precharge signal IOPR and the read signal lines RIOT/RIOB is made high, for example.

On the other hand, the characteristics of devices for the precharge MOSFETs Q5 through Q7 involve a degradation phenomenon (NBTI) that holes are injected into a gate oxide film when the bias of each gate to the source/drain is negative, so that a threshold voltage Vth is shifted (raised) and the conductance of each of the MOSFETs Q5 through Q7 is reduced. Hence there is a need to carry out device design with a target standard of $\Delta Vth=20$ mV/10 years, for example.

Namely, there is a need to perform design having a timing margin so as to withstand a $\Delta Vth$ shift of 20 mV upon design of a memory circuit. Since much time necessary for an actual operation of the dynamic RAM at the time that the dynamic RAM is mounted on a system, is held in a standby state, and the signal lines RIOT/RIOB are held in a state of being precharged by the precharge MOSFETs Q5 through Q7, the gates thereof that produce NBTI degradation, are kept in a negative bias state (−VDD), and hence the CAS cycle must be designed inclusive of a sufficient timing margin.

In the dynamic RAM, however, there has been an increasingly demand for speeding up of the CAS cycle for the purpose of speeding up its operation. The timing margin is becoming unallowable. Therefore, the present invention intends to control the precharge signal IOPR to such a bias condition that the NBTI degradation is not developed in the standby state taking up the actual operation in excess as shown in the timing diagram of FIG. 2 to thereby make a timing margin corresponding to the NBTI degradation unnecessary and speed up the CAS cycle, thus enhancing the performance of the system.

Since, in the present embodiment, the precharge of the read signal lines RIOT/RIOB is stopped and the precharge signal is controlled to such a bias state as not to develop the NBTI degradation during a standby period in which the row address strobe signal RASN is high in level, the NBTI degradation in actual use is not almost produced and the precharge time is degraded either, thereby making it possible to speedup-design the CAS cycle. Namely, a bias voltage Vgs of each gate relative to the source/drain becomes 0V as shown in the timing diagram of FIG. 2, thus resulting in an NBTI degradation-free state.

Figure 3:
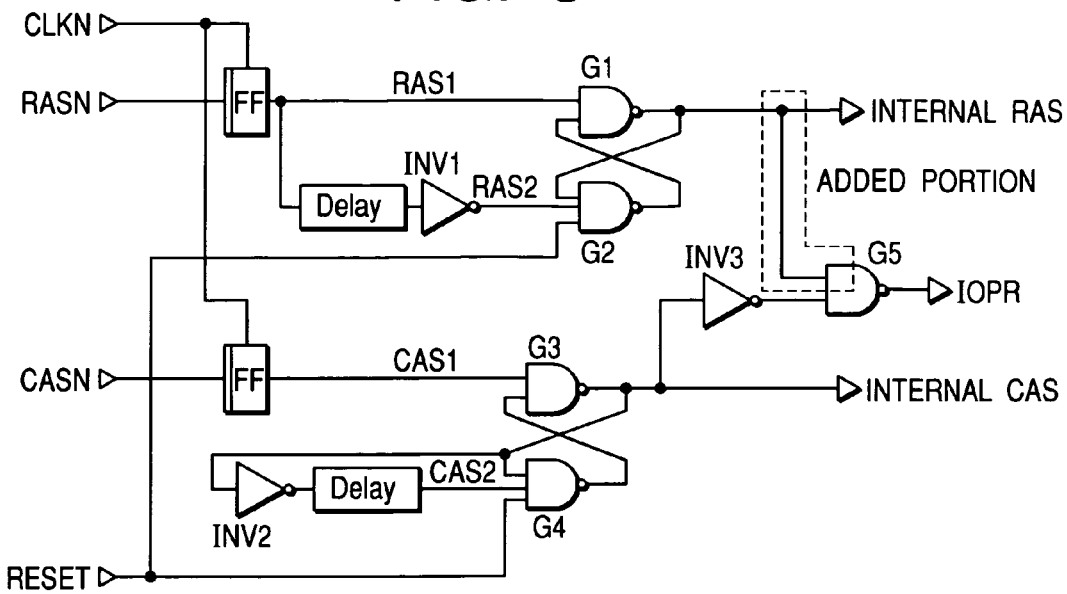
FIG. 3 is a circuit diagram illustrating one embodiment of a timing generator for forming a precharge signal IOPR shown in FIG. 2.

A circuit diagram of one embodiment of a timing generator for forming the precharge signal IOPR is shown in FIG. 3. In the same drawing, CLKN indicates the basic clock, RASN indicates a row control (row address strobe) signal, CASN indicates a column control (column address strobe) signal, and RSETN indicates an initialization (reset) signal, respectively. The present circuit comprises flip-flops FFs, inverters INV1 through INV3, gates G1 through G5, and delays Delays.

An internal RAS is produced by delaying the negate side of the row address strobe signal RASN and thereby expanding its pulse width. An internal CAS is produced based on one shot pulse having a width determined by an internal delay in response to the assertion of the column address strobe signal CASN. In the present embodiment, a NAND gate G5 receiving therein the internal RAS during a so-called standby period in which the row address strobe signal RASN and column address strobe signal CASN both taking up a major part of time in an actual use state are also high in level, is added to thereby configure logic such that the precharge signal IOPR is negated. Thus, the standby period in which the row address strobe signal RASN is high in level, makes it possible to stop the precharge of the read signal lines RIOT/RIOB and bring about a bias state in which no NBTI degradation occurs in the precharge MOSFETs Q5 through Q7.

Figure 4:
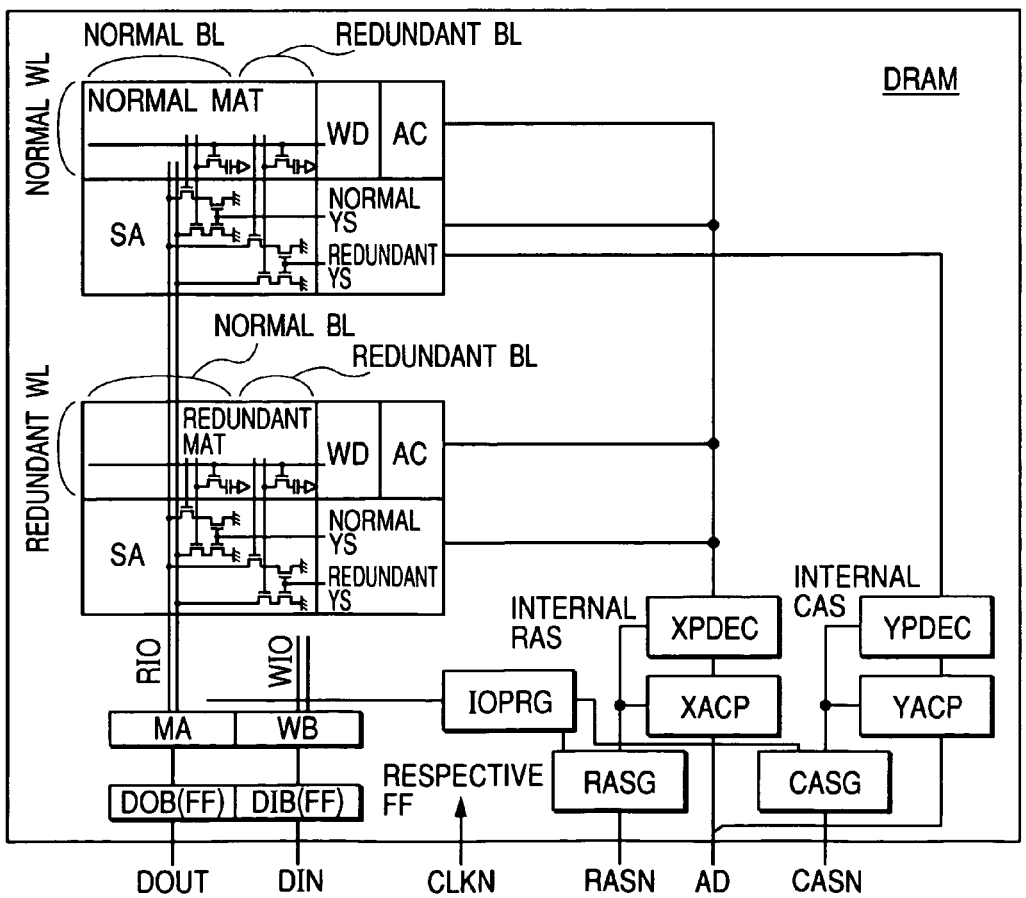
FIG. 4 is an overall configuration diagram showing one embodiment of a read system circuit in a dynamic RAM according to the present invention.

An overall configuration diagram of one embodiment of a read system circuit in a dynamic RAM according to the present invention is shown in FIG. 4. An internal RAS generator RASG forms or produces an internal RAS according to a row address strobe signal RASN in response to the row address strobe signal RASN. This internal RAS signal is transferred to an X address latch and comparator XACP, an X predecoder XPDEC, and a precharge signal generator IOPRG. The X address latch and comparator XACP performs the capturing of a row address and a defective address comparison. The X predecoder XPDEC supplies a signal obtained by predecoding the address to array controllers ACs of memory mats.

Each of the array controllers ACs forms a select signal for each word line, activates the word line through a word driver WD, and controls the startup of a sense amplifier SA, operating timings provided to precharge bit lines BLT and BLB and the lowering of each word line. When the address latch and comparator XACP now detects that a failure occurs in a normal word line, the operation of selecting each normal word line of the corresponding normal mat is stopped and a redundant word line of a redundant mat is selected as an alternative to it. According to such word-line switching, the sense amplifier SA of the normal mat is deactivated and the sense amplifier SA of the corresponding redundant mat is activated.

In response to a column address strobe signal CASN, an internal CAS generator CASG forms an internal CAS according to it. This internal CAS signal is transferred to a Y address latch and comparator YACP, a Y predecoder YPDEC, and the precharge signal generator IOPRG. The Y address latch and comparator YACP performs the capturing of a column address and a defective address comparison. The Y predecoder YPDEC supplies a signal obtained by predecoding the address to column selectors or selection circuits of the memory mats.

Thus, an address for each activated column select signal YS is latched according to the internal CAS generated from the column address strobe signal CASN, whereby the activation of the column select signal, the startup of a main amplifier MA and timing provided to precharge signal lines RIOT/RIOB are controlled. In the present invention, the internal RAS is also added to perform the control on the precharge timing for the signal lines RIOT/RIOB. Thus, such a bias state that no NBTI degradation occurs in the precharge MOSFETs Q5 through Q7 during the standby period, can be brought about. Data amplified by the main amplifier MA is outputted through an output circuit DOB as a read signal DOUT. The output circuit DOB is provided with a latch FF.

Although not restricted in particular, the DRAM according to the present embodiment is provided with a write path or route separately from the read path. A write signal DIN is inputted through an input circuit DIB and transferred to a write buffer WB. The write buffer WB drives each write signal line WIO and thereby transfers the write signal to bit lines BLT and BLB selected by the corresponding column select signal YS. Consequently, the corresponding word line is selected and thereby an electrical charge corresponding to the write signal is written into its corresponding memory capacitor of a memory cell connected to the bit line BLT or BLB to which the write signal is transferred.

Figure 5:
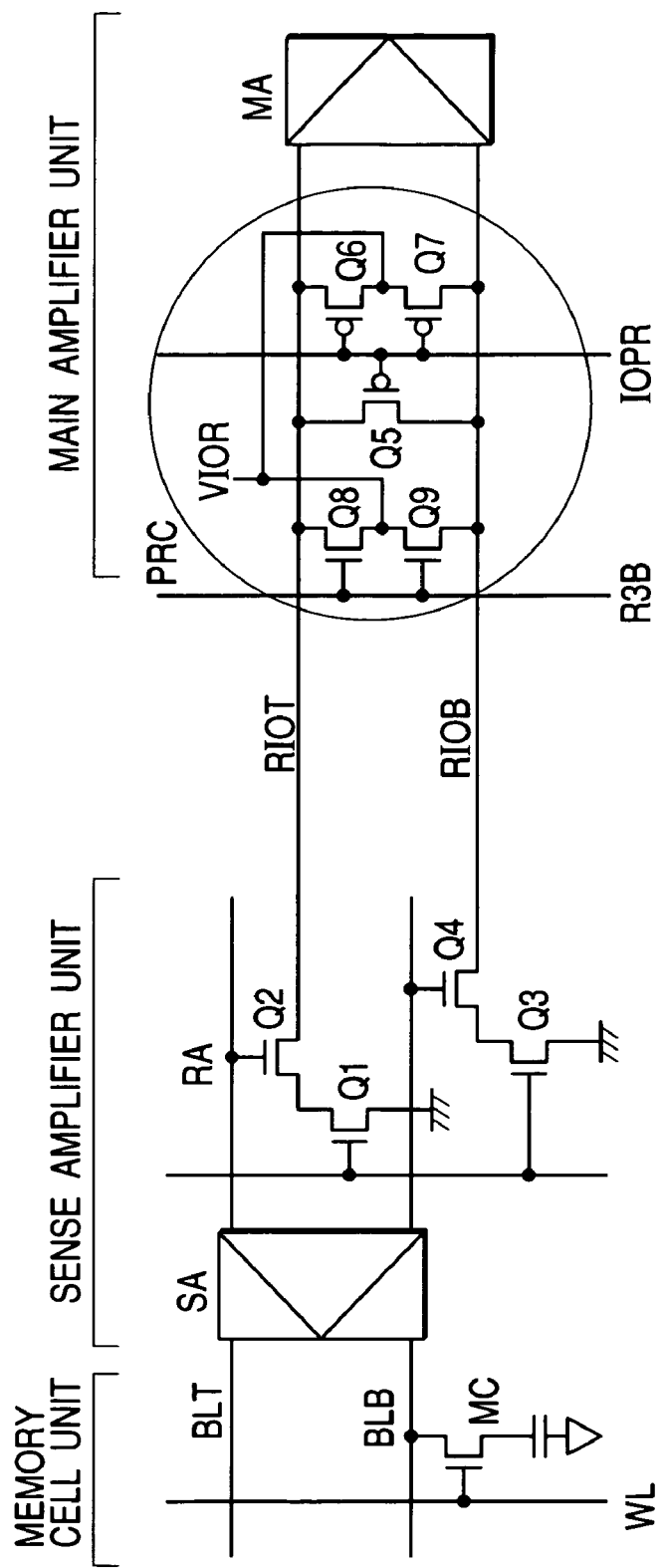
FIG. 5 is a circuit diagram illustrating another embodiment of a read system from a sense amplifier SA of a dynamic RAM mounted in a semiconductor integrated circuit device according to the present invention to a main amplifier MA thereof.

A circuit diagram of another embodiment of a read system from a sense amplifier SA of a dynamic RAM mounted in a semiconductor integrated circuit device according to the present invention to a main amplifier MA thereof is shown in FIG. 5. The present embodiment is basically similar to the embodiment of FIG. 1 but performs such a contrivance as to recover NBTI degradation developed in an active period (precharge operation period) as well as to suppress the NBTI degradation in the precharge-MOSFETs Q5 through Q7 as in the embodiment shown in FIG. 1.

The NBTI degradation in the MOSFETs has such a characteristic that when biases applied between a gate and a source and drain are made positive in reverse, the degradation is recovered. Using such a characteristic, N channel MOSFETs Q8 and Q9 are added to change a precharge voltage VIOR supplied to MOSFETs Q6 and Q7 to a ground potential VSS (0V) upon standby. The changed precharge voltage VIOR (VSS) is transferred to its corresponding read signal lines RIOT/RIOB through the added MOSFETs Q8 and Q9. Being supplied with a row timing signal R3B controls the gates of the MOSFETs Q8 and Q9.

Figure 6:
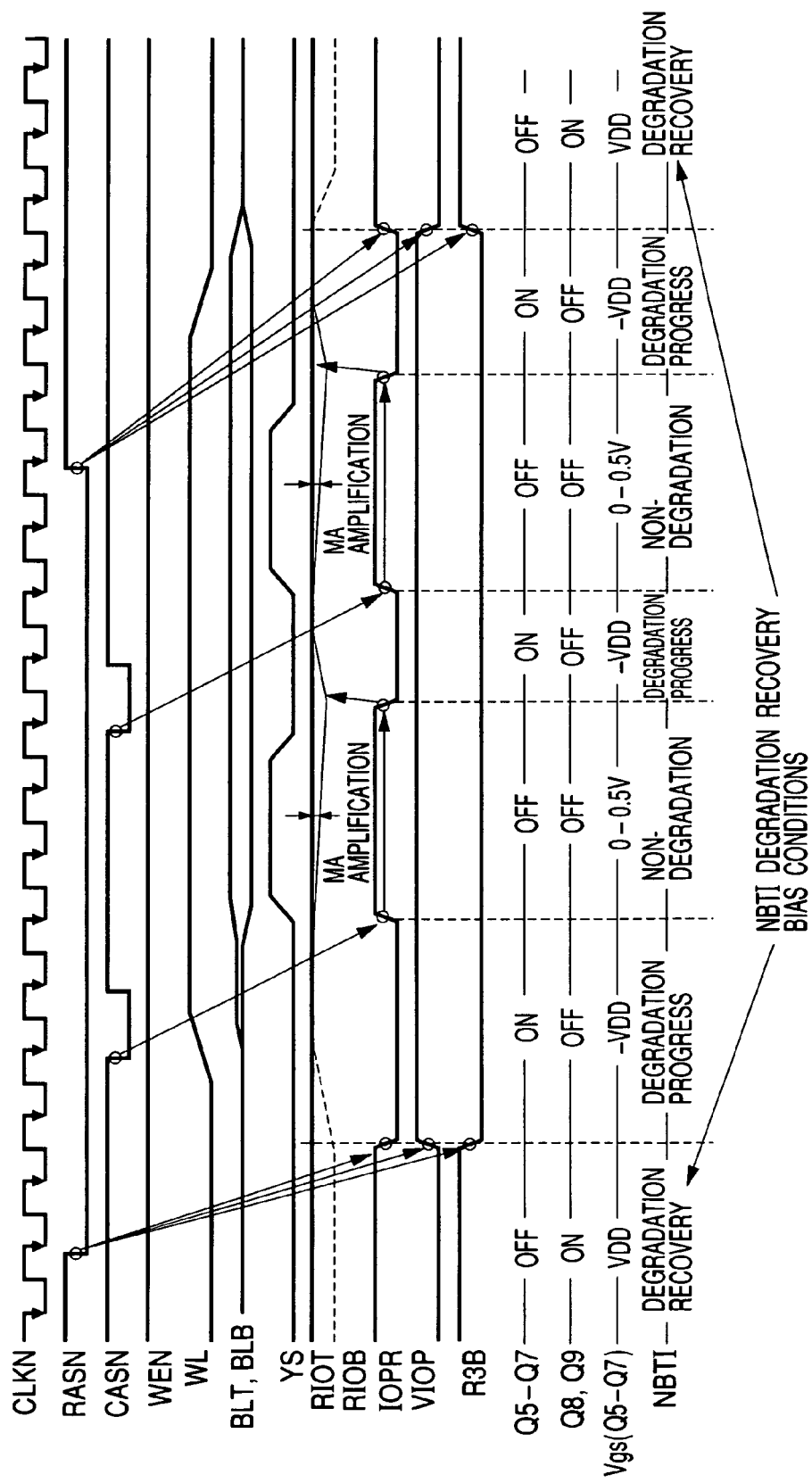
FIG. 6 is a timing diagram for describing one example of the operation of the dynamic RAM shown in FIG. 5.

A timing diagram for describing one example of the operation of the dynamic RAM of FIG. 5 is shown in FIG. 6. While the present timing diagram is basically similar to the timing diagram of FIG. 2, the signal R3B is brought to a high level during a standby period to thereby bring the MOSFETs Q8 and Q9 into an on state. Thus, the read signal lines RIOT/RIOB are fixed to the circuit's ground potential VSS without being fixed to such a floating state as shown in FIG. 2. The precharge voltage VIOR is also switched to the ground potential VSS.

Thus, the gates of the P channel MOSFETs Q5 through Q7 are fixed to a high level like a power supply voltage VDD similarly to FIG. 2, and their sources and drains are respectively set to the low levels (VSS) of the signal lines ROT/RIOB and precharge voltage VIOR, so that a voltage Vgs between each gate and its corresponding source/drain is set to a positive voltage like VDD. Thus, NBTI degradation developed in the MOSFETs Q5 through Q7 is recovered.

Incidentally, a precharge signal IOPR is set to VSS in response to a signal RASN during a precharge period in a manner similar to the embodiment of FIG. 2 to bring the precharge MOSFETs Q5 through Q7 to an on state, so that the precharge voltage VIOR is switched to the power supply voltage VDD to precharge the signal lines RIOT/RIOB to the power supply voltage VDD. At this time, the MOSFETs Q8 and Q9 are in an off state according to a low level of the signal R3B.

Figure 7:
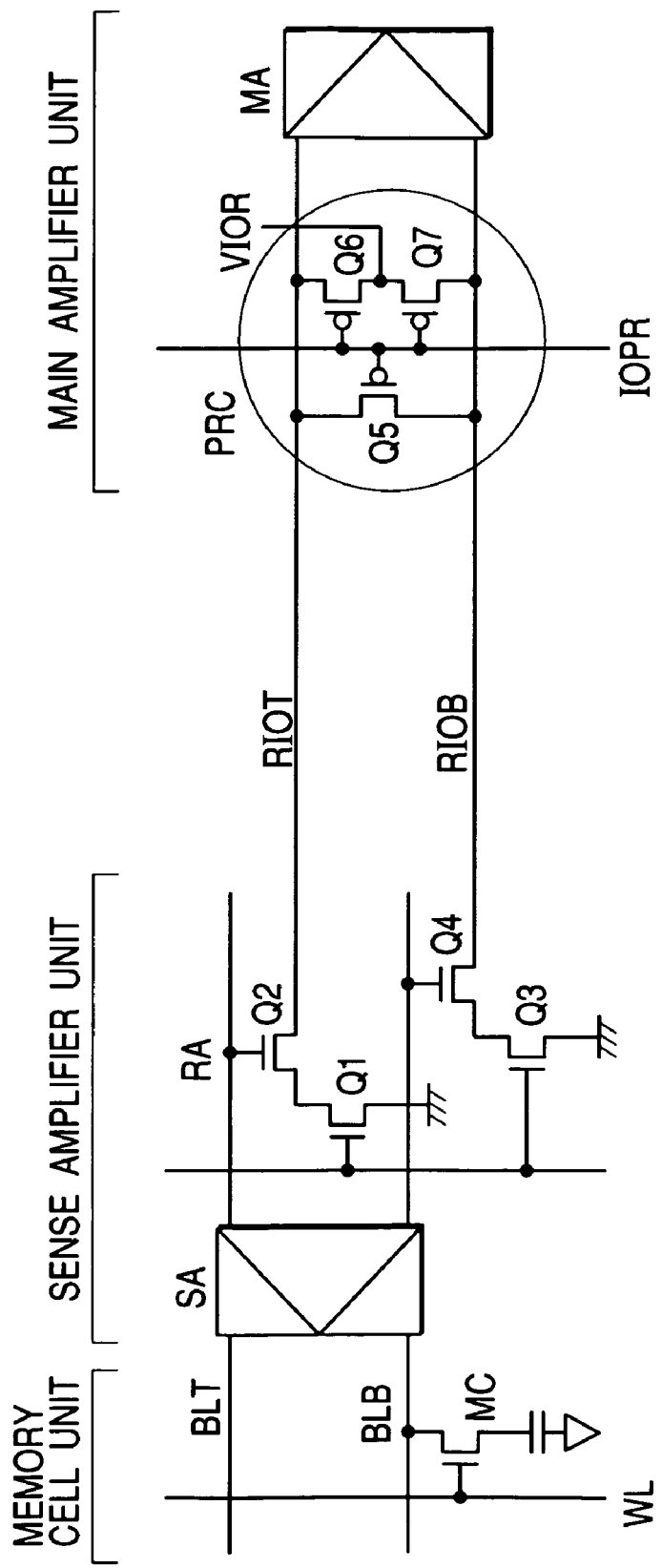
FIG. 7 is a circuit diagram showing a further embodiment of a read system from a sense amplifier SA of a dynamic RAM mounted in a semiconductor integrated circuit device according to the present invention to a main amplifier MA thereof.

A circuit diagram showing a further embodiment of a read system from a sense amplifier SA of a dynamic RAM mounted in a semiconductor integrated circuit device according to the present invention to a main amplifier MA thereof is shown in FIG. 7. The present embodiment is an improved one of the embodiment shown in FIG. 5. The present embodiment is one in which such a contrivance as to realize the function of recovering NBTI degradation produced during an active period (precharge operation period) in a manner similar to the embodiment of FIG. 5 without the addition of the MOSFETs Q8 and Q9 is performed. Namely, MOSFETs Q1 through Q4 of a read amplifier RA are utilized to bring read signal lines RIOT/RIOB to a low level for the purpose of recovering the NBTI degradation, whereby the MOSFETs Q8 and Q9 are omitted.

Figure 8:
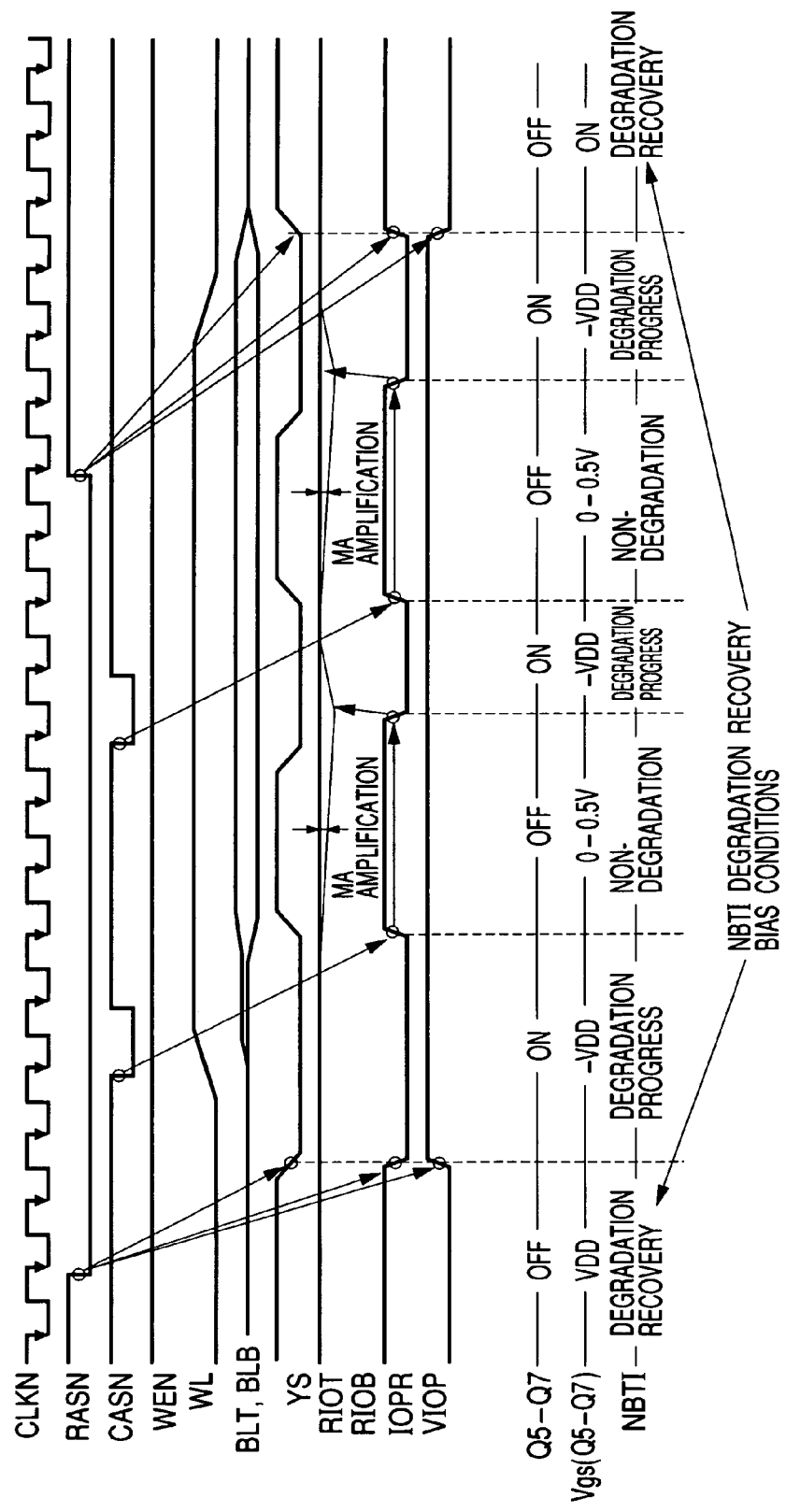
FIG. 8 is a timing diagram for describing one example of the operation of the dynamic RAM shown in FIG. 7.

A timing diagram for describing one example of the operation of the dynamic RAM shown in FIG. 7 is shown in FIG. 8. The present timing diagram is basically similar to the timing diagram shown in FIG. 6. In the present timing diagram, however, any one column select signal YS is brought to a high level during a standby period, so that the MOSFETs Q1 and Q3 of any one read amplifier are brought to an on state. Upon the standby, a half precharge voltage is set to bit lines BLT and BLB corresponding to it so that the MOSFETs Q2 and Q4 are brought to an on state. Accordingly, the setting of any one column select signal YS to the high level during the standby period as described above makes it possible to pull the read signal lines RIOT/RIOB to a low level.

Currents that flow through the MOSFETs Q2 and Q4 brought to the on state by the half precharge voltage, become small according to the voltage. Thus, even though the time required to pull the read signal lines to the low level becomes long as compared with the case where the MOS- FETs Q8 and Q9 are provided for the read signal lines RIOT/RIOB, no problem occurs because the standby period per se is long. The read signal lines RIOT/RIOB are fixed to a circuit's ground potential VSS by use of the read amplifier RA in this way. A precharge voltage VIOR is also switched to the circuit ground potential VSS.

Accordingly, the gates of P channel MOSFETs Q5 through Q7 are respectively fixed to a high level like a power supply voltage VDD in a manner similar to FIG. 2, and their sources and drains are respectively set to the low levels (VSS) of the signal lines ROT/RIOB and precharge voltage VIOR, so that a voltage Vgs between each gate and its corresponding source/drain is set to a positive voltage like VDD. Thus, NBTI degradation developed in the MOSFETs Q5 through Q7 is recovered.

Figure 9:
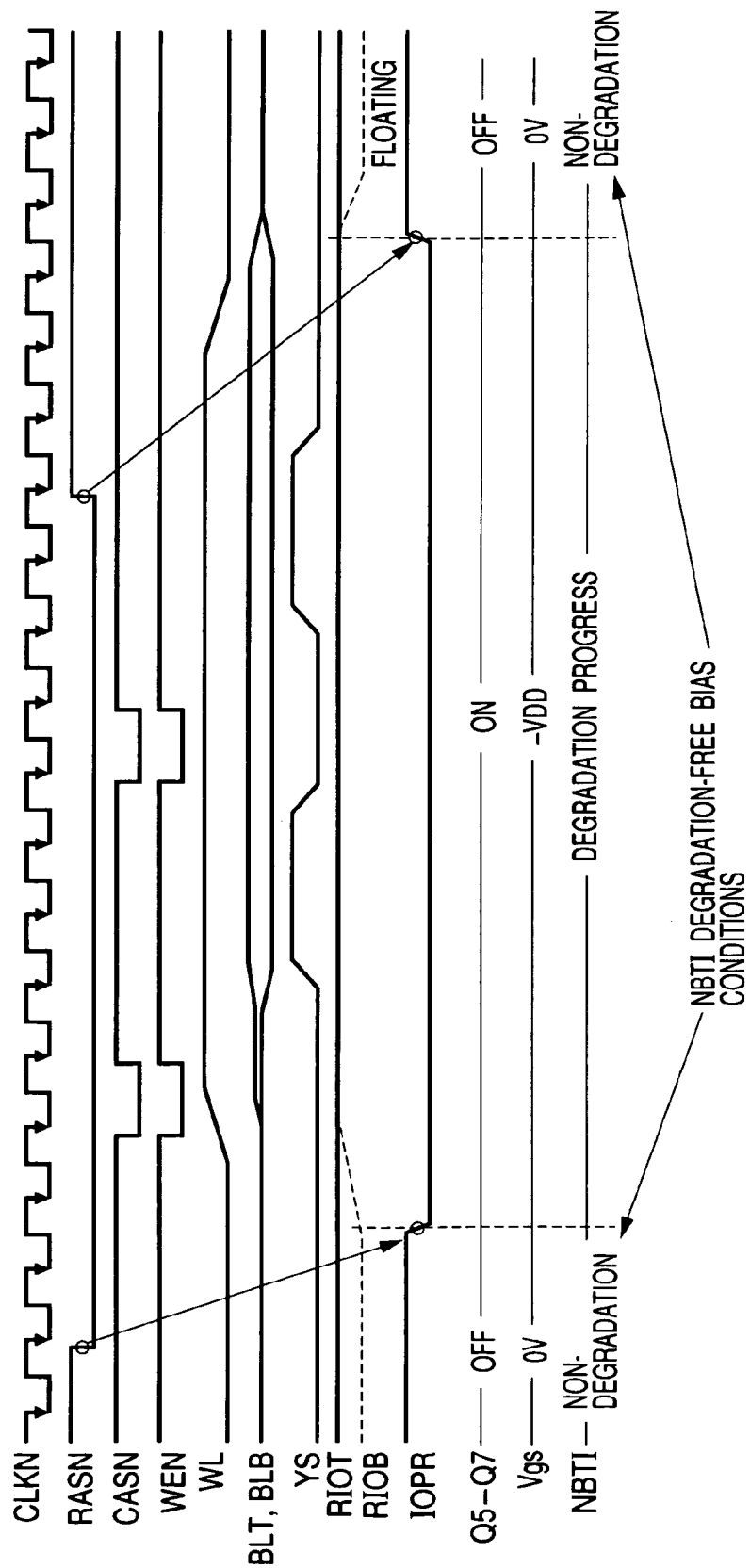
FIG. 9 is a timing diagram for describing another example of the operation of the dynamic RAM according to the present invention.

A timing diagram for describing another example of the operation of the dynamic RAM according to the present invention is shown in FIG. 9. A timing diagram of the read system circuit during a write cycle is illustrated in the same drawing. During the write cycle, write data is transferred to a memory cell selected through the write signal line WIO of FIG. 4. Since, at this time, the read signal lines RIOT/RIOB have been precharged, a bias relationship in which the NBTI degradation proceeds, is established even in the present invention. However, the standby period, which takes up a lot of actual operations, makes it possible to suppress the degradation because it is in bias relation in which no degradation proceeds, in a manner similar to the read cycle.

The DRAM added with the NBTI degradation recovery function shown in each of the embodiments illustrated in FIGS. 5 and 7 makes it possible to recover the progress of NBTI degradation of the read signal lines ROT/RIOB developed during the write cycle.

Figure 10:
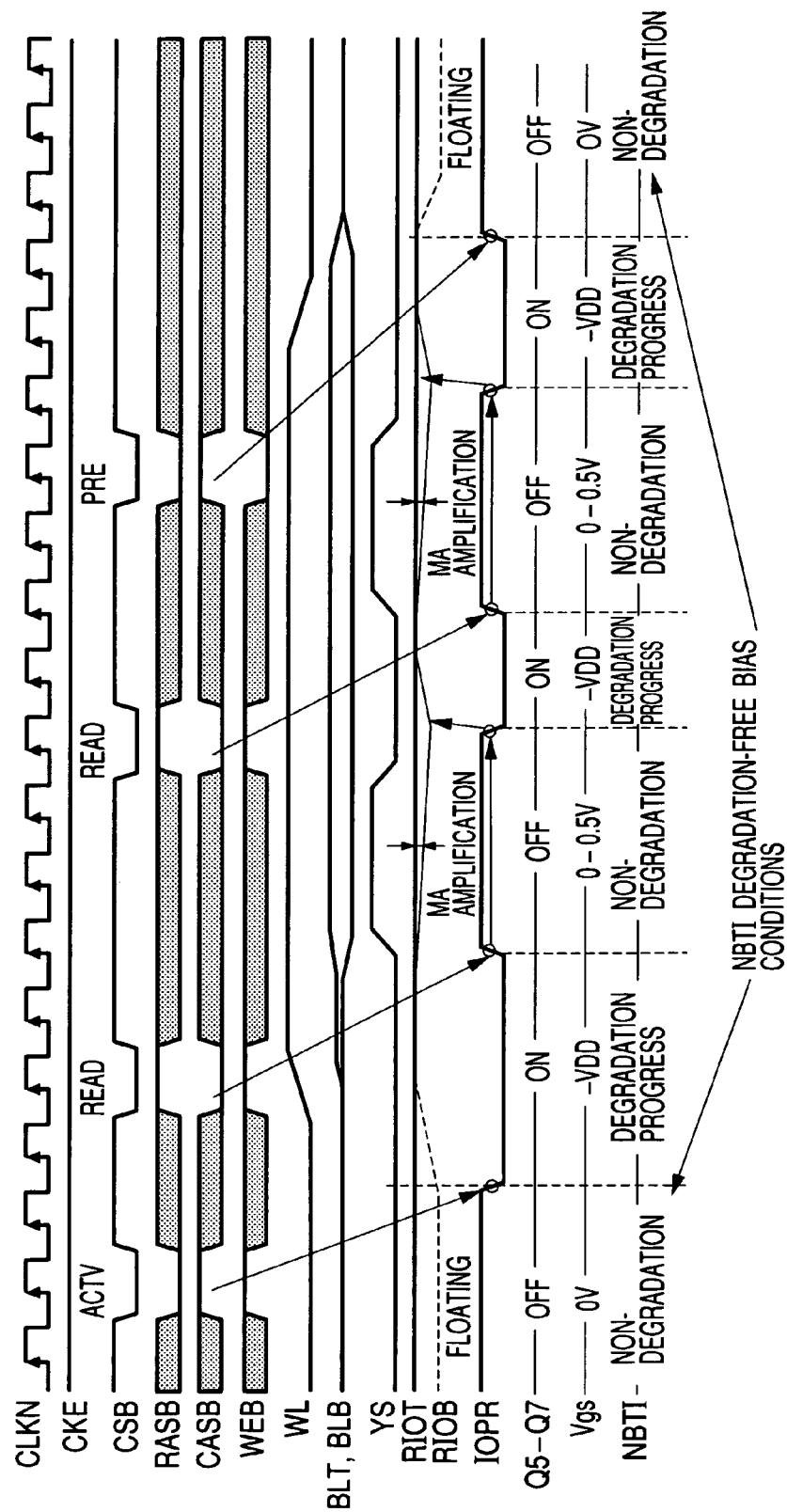
FIG. 10 is a timing diagram for describing a further example of the operation of the dynamic RAM according to the present invention.
Figure 11:
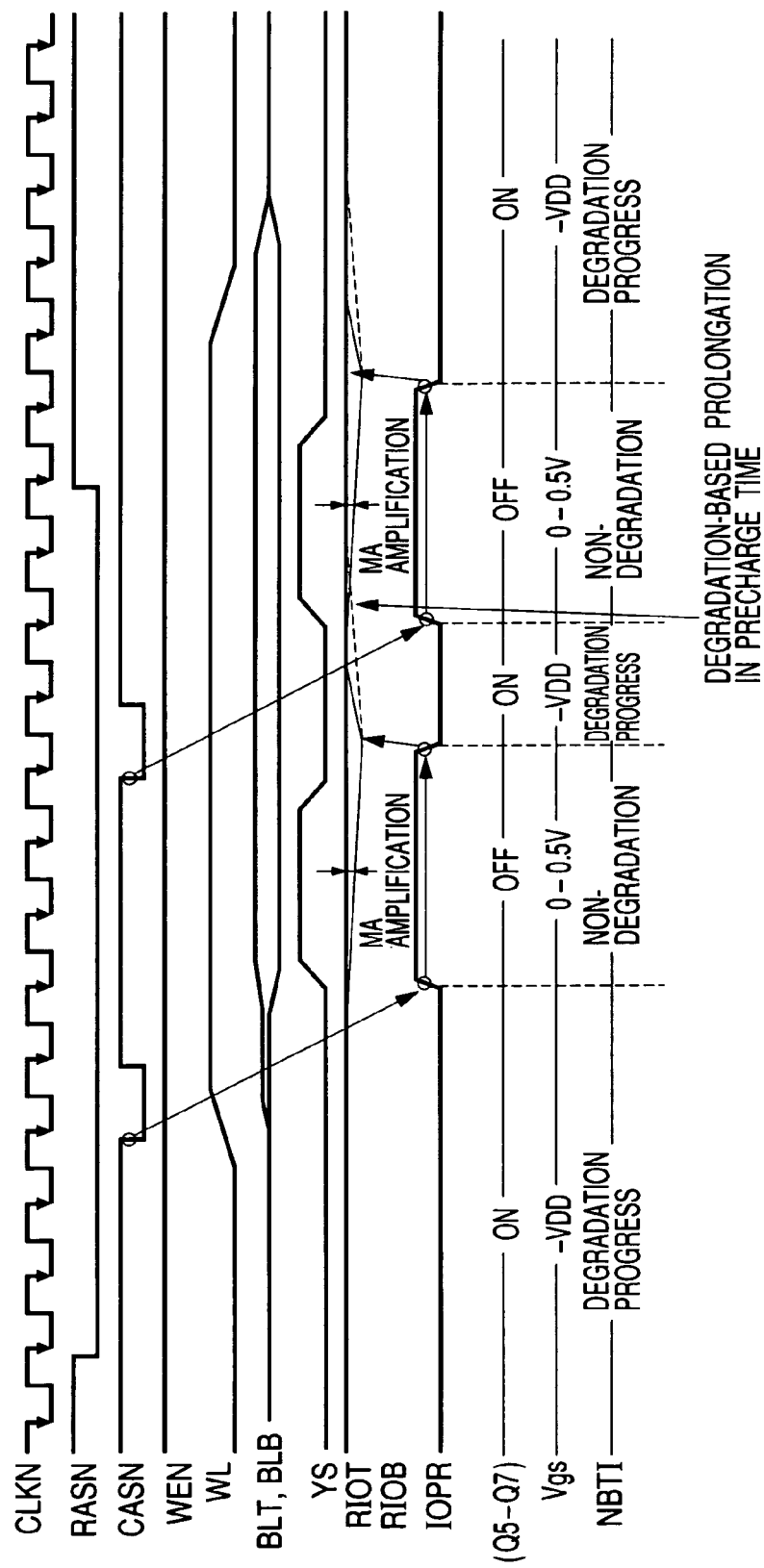
FIG. 11 is a waveform diagram for describing the operation of a synchronous DRAM discussed by the inventors of the present application prior to the present invention.

A timing diagram for describing a further example of the operation of the dynamic RAM according to the present invention is shown in FIG. 10. The present embodiment is intended for a synchronous DRAM (hereinafter called simply "SDRAM"). While the SDRAM is operated by being inputted with operation commands according to signals such as RASB, CASB, WEB, etc., internal operations thereof are the same as in the case where, for example, an ACTV (active) command is equivalent to the RASN assertion of FIG. 2 and a PRE (precharge) command is equivalent to the RASN negation of FIG. 2. Therefore, the present invention can be applied as it is.

For instance, an unillustrated chip select signal CSB gives instructions for the start of a command input cycle according to its low level. A case in which the chip select signal CSB is high in level (in a chip non-selected state), and other inputs are meaningless. However, the state of selection of each memory bank to be described later, and internal operations such as a burst operation or the like are not affected by a change to the chip non-selected state. The respective signals of RASB, CASB and WEB are different in function from the corresponding signals (the RASN, CASN and WEN) employed in a normal DRAM and are defined as signals significant when a command cycle to be described later is defined.

A clock enable signal CKE is a signal for instructing validity of the next clock signal. When the corresponding signal CKE is high in level, the rising edge of the next clock signal CLKN is made valid, whereas when the signal CKE is low in level, it is rendered invalid. Incidentally, when an external control signal OEB for effecting output enable control on a data output circuit is provided, such a signal OEB is also supplied to a control circuit. When the signal is high in level, for example, the data output circuit is brought to a high output impedance state.

The row address signal is defined according to the level of an address signal in a row address strobe/bank active command cycle synchronized with the rising edge of the clock signal CLKN (internal clock signal). An upper-bit signal of the address signal is regarded as a bank select signal in the row address strobe/bank active command cycle. One of four memory banks 0 through 3 is selected by a combination of A12 and A13, for example. Control on the selection of each memory bank can be performed by processes such as the activation of only a row decoder on the selected memory bank side, all the non-selection of column switch circuits on the non-selected memory bank side, connections to a data input circuit and a data output circuit on the selected memory banks side alone, etc.

A column address is taken in or captured by a READ (read) command to start a selecting operation of a column system. Therefore, the precharge operation of the read signal lines RIOT/RIOB is completed according to the input of the READ command to transmit read signals. Since the PRE (precharge) command corresponds to the RASN negation as described above and thereby enters a standby period, the precharge operation of the read signal lines RIOT/RIOB is completed to enter into a floating state.

While a Rambus-spec DRAM is known as a memory using dynamic memory cells, even this DRAM is operated according to a command equivalent to ACTV/READ or the like given by a packet. Therefore, the present invention can be applied in a manner similar to the above SDRAM.

In the invention of the present application described above, P channel MOSFETs for IO-line precharge are set to such a bias condition as to make it hard to cause NBTI degradation upon standby or as to recover the NBTI degradation, thereby making it possible to speed up a CAS cycle. Namely, since they are less subject to a time extension expended on precharge due to NBTI degradation, a circuit's high-speed operation can be assured. As a result, selective yields are enhanced because a semiconductor integrated circuit device can be shipped even if sorted on the verge of its specs. An aim at developing a device with the NBTI degradation is about 20 mV/10 years as described above. However, when the present circuit system is used, the shift amount of Vth can be set to an almost negligible level, and hence a circuit's high-speed operation can be assured.

While the invention developed above by the present inventors has been described specifically based on the illustrated embodiments, the invention of the present application is not limited to the embodiments. It is needless to say that various changes can be made thereto within the scope not departing from the substance thereof. The sense amplifier SA can be regarded as a static memory cell in FIG. 1 and the like, for example. Namely, even when a static RAM is configured in such a manner that a plurality of memory cells comprising CMOS latch circuits each corresponding to a sense amplifier SA are connected to a memory cell unit and selected by their corresponding word lines, the present invention can similarly be applied. In such a case, precharge MOSFETs are controlled by a mat enable signal or chip enable signal CE in response to a RAS signal employed in a DRAM.

In the embodiment shown in FIG. 4 and the like, the write signal line WIO may be configured as a common IO line used in common with the read signal line RIO. The present invention can be widely used in semiconductor integrated circuit devices each equipped with the above DRAM, SRAM, flash memory, and other general memory products.

Advantageous effects obtained by a typical one of the inventions disclosed in the present application will be described in brief as follows: A memory cell is selected from within a memory array having a plurality of memory cells by a selector or selection circuit. MOSFETs constituting a precharge circuit provided for signal lines for transferring a read signal therefrom to a main amplifier are respectively brought to an on state based on a memory cell select start signal transferred to the selection circuit and brought to an off state prior to the transfer of the read signal from the memory cell to thereby complete precharging, whereby NBTI degradation at standby can be avoided.

What is claimed is:

1. A semiconductor integrated circuit device comprising:
    a word line;
    a first bit line;
    a memory cell arranged at intersection between the word line and the bit line;
    a column selection switch coupled to the bit line;
    a signal line pair coupled to the column selection switch; and
    a precharge circuit including a P-type first MOSFET whose source or drain is coupled to the signal line pair and whose gate is coupled to a precharge signal line,
    wherein a potential supplied to the precharge signal line changes a first potential to a second potential smaller than the first potential based on the change in RAS signal.

2. A semiconductor integrated circuit device according to claim 1,
    wherein the potential supplied to the precharge signal line changes the second potential to the first potential based on the change in CAS signal.

3. A semiconductor integrated circuit device according to claim 1, further comprising:
    wherein the source and drain of the first MOSFET are coupled between one of the signal line pair and the first potential,
    wherein the precharge circuit includes a P-type second MOSFET whose source and drain are coupled the other of the signal line pair and the first potential and a P-type third MOSFET whose source and drain are coupled between the signal line pair, and
    wherein gates of the second and third MOSFET are coupled to the precharge signal line.

4. A semiconductor integrated circuit device according to claim 1, further comprising:
    a bit line pair including the first bit line and a second bit line,
    a fourth MOSFET source and drain of the fourth MOSFET being coupled between the column selection switch and one of the signal line pair; and
    a fifth MOSFET source and drain of the fifth MOSFET being coupled between the column selection switch and the other of the signal line pair; and
    wherein a gate of the fourth MOSFET is coupled to the first bit line and a gate of the fifth MOSFET is coupled to the second bit line.

5. A semiconductor integrated circuit device according to claim 4,
    wherein the bit line pair is supplied the third potential between the first and second potential in standby term of the semiconductor integrated circuit.

6. A semiconductor integrated circuit device according to claim 1,
    wherein in a first term, the signal line pair is supplied the first potential and the precharge signal line is supplied the second potential, and
    wherein in a second term, the signal line pair is supplied the second potential and the precharge signal line is supplied the first potential.

7. A semiconductor integrated circuit device according to claim 6, further comprising:
    a sixth MOSFET, one of the source and drain being coupled to one of the signal line pair, and
    a seventh MOSFET, one of the source and drain being coupled to the other of the signal line pair,
    wherein in the first term, the signal line pair is supplied the second potential via the six and seventh MOSFETs.

* * * * *